US010955753B2

(12) United States Patent
Kasa

(10) Patent No.: US 10,955,753 B2
(45) Date of Patent: Mar. 23, 2021

(54) SUBSTRATE PROCESSING CONTROL APPARATUS, RECORDING MEDIUM, AND METHOD OF MANUFACTURING PHOTOMASK

(71) Applicant: TOSHIBA MEMORY CORPORATION, Minato-ku (JP)

(72) Inventor: Kentaro Kasa, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 393 days.

(21) Appl. No.: 16/032,302

(22) Filed: Jul. 11, 2018

(65) Prior Publication Data
US 2019/0294052 A1    Sep. 26, 2019

(30) Foreign Application Priority Data

Mar. 20, 2018  (JP) .............................. JP2018-053216

(51) Int. Cl.
G03F 1/70       (2012.01)
G03F 7/20       (2006.01)
G03F 1/72       (2012.01)
G03F 1/60       (2012.01)

(52) U.S. Cl.
CPC ............ G03F 7/70191 (2013.01); G03F 1/60 (2013.01); G03F 1/70 (2013.01); G03F 1/72 (2013.01); G03F 7/70125 (2013.01); G03F 7/70633 (2013.01)

(58) Field of Classification Search
CPC ............. G03F 7/70125; G03F 7/70633; G03F 7/70191; G03F 7/70625; G03F 1/00

USPC ........................ 355/52, 53, 55; 430/5, 20, 30
See application file for complete search history.

(56) References Cited

U.S. PATENT DOCUMENTS

| 7,736,819 B2 | 6/2010 | Zait et al. |
| 8,653,483 B2 * | 2/2014 | Itoh ........................ G03F 7/0002 |
| | | 250/492.1 |
| 9,606,444 B2 | 3/2017 | Dmitriev et al. |
| 9,658,527 B2 | 5/2017 | Dmitriev |

(Continued)

FOREIGN PATENT DOCUMENTS

| JP | 2007-531249 | 11/2007 |
| JP | 2012-2232 | 1/2012 |

(Continued)

OTHER PUBLICATIONS

Sharoni, O. et al. "Intra-field On-Product Overlay improvement by application of RegC® and TWINSCAN™ corrections," Proc. of SPIE, vol. 9424, 2015, pp. 11.

Primary Examiner — Hung Nguyen
(74) Attorney, Agent, or Firm — Oblon, McClelland, Maier & Neustadt, L.L.P.

(57) ABSTRACT

In one embodiment, a substrate processing control apparatus includes a position information acquiring module configured to acquire information about a position of a first pattern that is formed in a substrate for a photomask to change an applied stress to the substrate or a transmittance of the substrate. The apparatus further includes a position determining module configured to determine, in accordance with the information about the position of the first pattern, a position of a second pattern to be formed in the substrate to change the applied stress to the substrate or the transmittance of the substrate.

5 Claims, 12 Drawing Sheets

(56) References Cited

U.S. PATENT DOCUMENTS

| | | | |
|---|---|---|---|
| 2008/0026300 A1* | 1/2008 | Itoh | G06F 30/398 430/5 |
| 2012/0154773 A1 | 6/2012 | Beyer | |
| 2015/0050584 A1* | 2/2015 | Choi | G03F 1/00 430/5 |
| 2017/0176866 A1 | 6/2017 | Dmitriev | |

FOREIGN PATENT DOCUMENTS

| | | |
|---|---|---|
| JP | 2014-504376 | 2/2014 |
| JP | 2014-525684 | 9/2014 |

\* cited by examiner

SUBSTRATE PROCESSING CONTROL APPARATUS, RECORDING MEDIUM, AND METHOD OF MANUFACTURING PHOTOMASK

CROSS REFERENCE TO RELATED APPLICATION

This application is based upon and claims the benefit of priority from the prior Japanese Patent Application No. 2018-053216, filed on Mar. 20, 2018, the entire contents of which are incorporated herein by reference.

FIELD

Embodiments described herein relate to a substrate processing control apparatus, a recording medium, and a method of manufacturing a photomask.

BACKGROUND

When a plurality of circuit patterns are formed on a wafer by lithography, a problem of overlay error arises between the circuit patterns. Therefore, it is considered to create a flaw or a haze in a substrate for a photomask to change the applied stress on the substrate or the transmittance of the substrate so as to correct an overlay error. In this case, since another flaw or haze cannot be formed at a position where a flaw or a haze has already been formed, there is a problem of constraints imposed on the correction of the overlay error.

DETAILED DESCRIPTION

Figure 1:
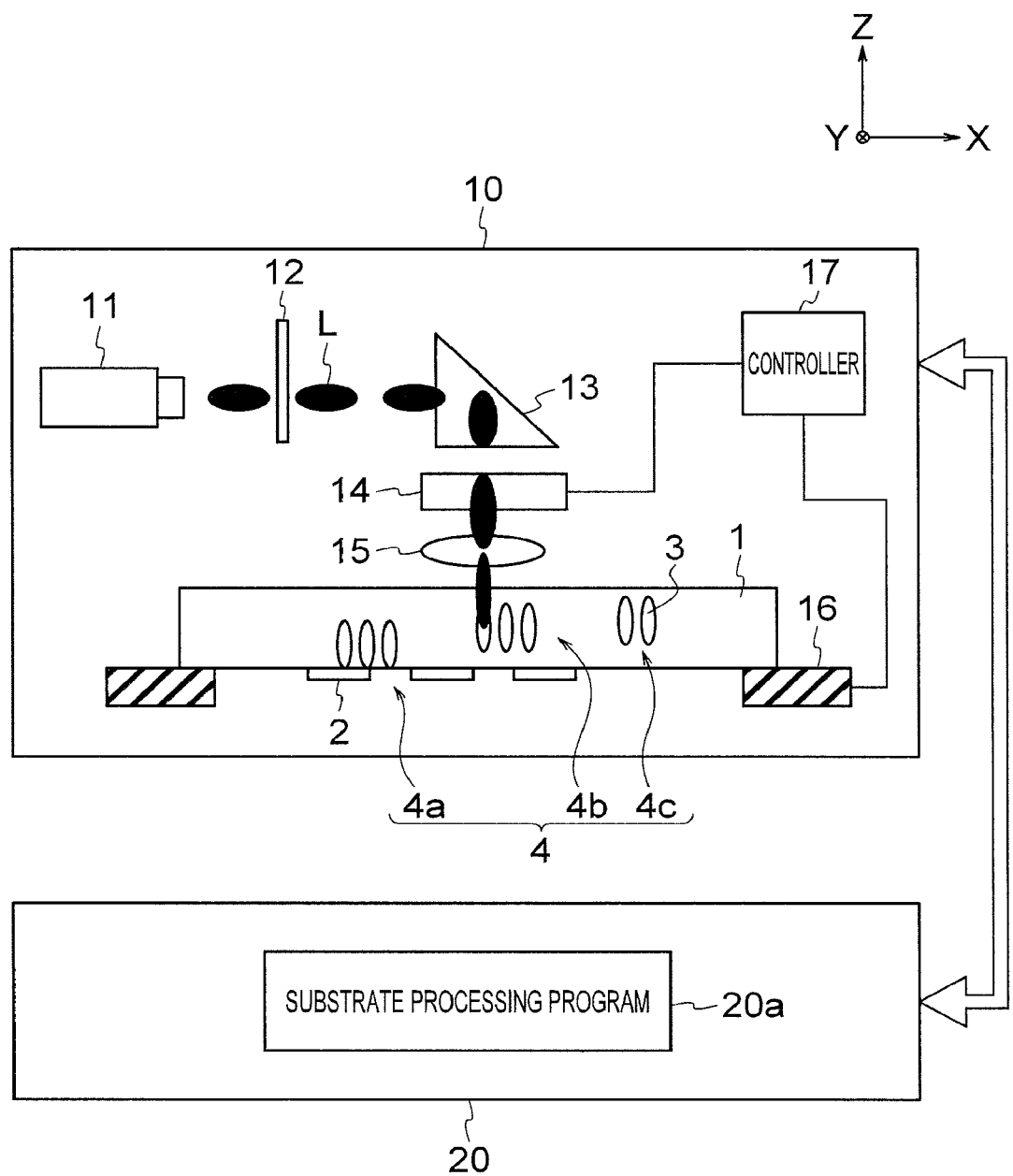
FIG. 1 is a cross sectional view showing the configuration of a substrate processing system of a first embodiment.

Embodiments will now be explained with reference to the accompanying drawings. Throughout FIGS. 1 to 12, identical or similar components are denoted by the same reference numerals, and an overlay explanation thereof is omitted.

In one embodiment, a substrate processing control apparatus includes a position information acquiring module configured to acquire information about a position of a first pattern that is formed in a substrate for a photomask to change an applied stress to the substrate or a transmittance of the substrate. The apparatus further includes a position determining module configured to determine, in accordance with the information about the position of the first pattern, a position of a second pattern to be formed in the substrate to change the applied stress to the substrate or the transmittance of the substrate.

First Embodiment

FIG. 1 is a cross sectional view showing the configuration of a substrate processing system of a first embodiment.

FIG. 1 illustrates a photomask including a substrate 1, a light shielding film 2 formed on the substrate 1, and a plurality of pixels 3 formed in the substrate 1. The substrate processing system in FIG. 1 includes a substrate processing apparatus 10 for processing the substrate 1 for the photomask, and a substrate processing control apparatus 20 for controlling processing of the substrate 1 by the substrate processing apparatus 10.

The substrate processing apparatus 10 includes a light source 11, an optical path adjusting device 12, a beam splitter 13, a wavefront adjusting device 14, a lens 15, a stage 16, and a controller 17. The substrate processing control apparatus 20 includes a substrate processing program 20a.

The substrate 1 is formed of a transparent member such as glass or quartz, and is also referred to as a reticle. FIG. 1 shows an X direction and a Y direction which are parallel with the upper surface and the lower surface of the substrate 1, and are orthogonal to each other, and shows a Z direction orthogonal to the upper surface and the lower surface of the substrate 1. Herein, the +Z direction is defined as the upward direction, and the −Z direction is defined as the downward direction. However, the −Z direction may coincide or may not coincide with the gravity direction. The direction orthogonal to the Z direction exemplifies the in-plane direction of the substrate 1, and the direction parallel with the Z direction exemplifies the thickness direction of the substrate 1.

The light shielding film 2 includes one or more light shielding patterns. When lithography is performed with use of the photomask of the present embodiment, the light shielding patterns are transferred to a resist film, so that resist patterns are formed.

The pixels 3 are flaws formed in the substrate 1 by the substrate processing apparatus 10 so as to change the applied stress on the substrate 1, or are hazes formed in the substrate 1 by the substrate processing apparatus 10 so as to change the transmittance of the substrate 1. The pixels 3 exemplify a first pattern and a second pattern.

FIG. 1 shows examples of the positions of a plurality of regions in the substrate 1, which are referred to as clusters 4. The clusters 4 of the present embodiment are columnar regions which are obtained by dividing the upper surface, the lower surface, or an XY cross section of the substrate 1 into a plurality of domains, and moving in the Z direction, the domains from the lower surface to the upper surface of the substrate 1. The pixels 3 of the first embodiment are formed, in the substrate 1, on the cluster 4 basis. In FIG. 1, as examples of the clusters 4, three clusters 4a to 4c are shown. A detailed description of the clusters 4 will be given later.

The light source 11 generates a laser pulse L for processing the substrate 1. An example of the laser is a femtosecond laser. The optical path adjusting device 12 adjusts the optical path of the laser pulse L. The beam splitter 13 changes the propagation direction of the laser pulse L. The wavefront adjusting device 14 adjusts the wavefront of the laser pulse L. The lens 15 condenses the laser pulse L into the substrate 1. The stage 16 supports the substrate 1, and also can move the substrate 1.

The controller 17 controls various operations of the substrate processing apparatus 10. For example, the controller 17 causes the wavefront adjusting device 14 to adjust the wavefront of the laser pulse L, and causes the stage 16 to move the substrate 1 in the ±X direction and the ±Y direction. The controller 17 is a processor or an electric circuit, for example.

The substrate processing control apparatus 20 controls processing of the substrate 1 by the substrate processing apparatus 10. For example, the substrate processing control apparatus 20 is a PC (personal computer) that executes the substrate processing program 20a to transmit data necessary for processing of the substrate 1 to the substrate processing apparatus 10. The substrate processing program 20a is installed in a storage in the substrate processing control apparatus 20. A detailed description of the substrate processing control apparatus 20 is given later.

Figure 2A:
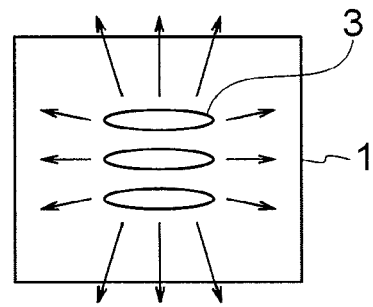
FIG. 2A to 2C are cross sectional views showing examples of pixels in a substrate of the first embodiment.
Figure 2B:
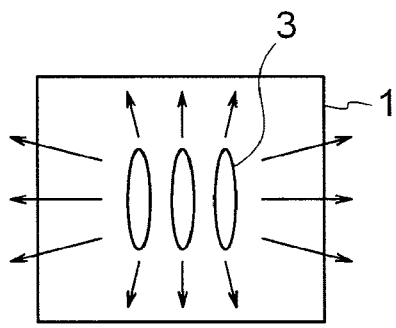
Figure 2C:
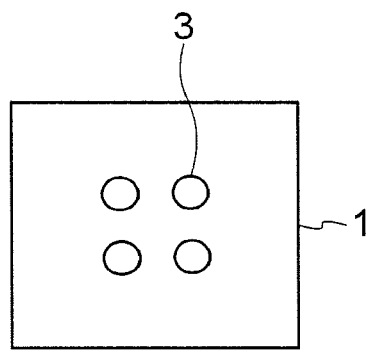

FIGS. 2A to 2C are cross sectional views showing examples of the pixels 3 in the substrate 1 of the first embodiment. FIGS. 2A to 2C each show the XY cross section of the substrate 1.

FIG. 2A shows a plurality of the pixels 3 formed in the cluster 4a. These pixels 3 are flaws for applying a Y-direction stress to the substrate 1, and can change a displacement or a dimension, of a prescribed portion of the substrate 1 in the Y direction. Hereinafter, the pixels 3 arranged as shown in FIG. 2A are referred to as first type pixels 3.

FIG. 2B shows a plurality of the pixels 3 formed in the cluster 4b. These pixels 3 are flaws for applying an X-direction stress to the substrate 1, and can change a displacement or a dimension, of a prescribed portion of the substrate 1 in the X direction. Hereinafter, the pixels 3 arranged as shown in FIG. 2B are referred to as second type pixels 3.

FIG. 2C shows a plurality of the pixels 3 formed in the cluster 4c. These pixels 3 are hazes for changing the light transmittance of the substrate 1, and can expand or contract the geometry of a prescribed portion of the substrate 1. Hereinafter, the pixels 3 arranged as shown in FIG. 2C are referred to as third type pixels 3.

Figure 3A:
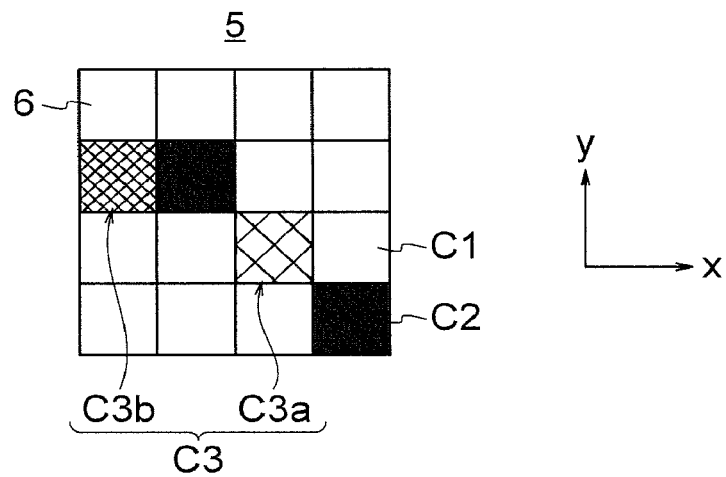
FIG. 3A to 3C are diagrams showing examples of a cluster map of the first embodiment.
Figure 3B:
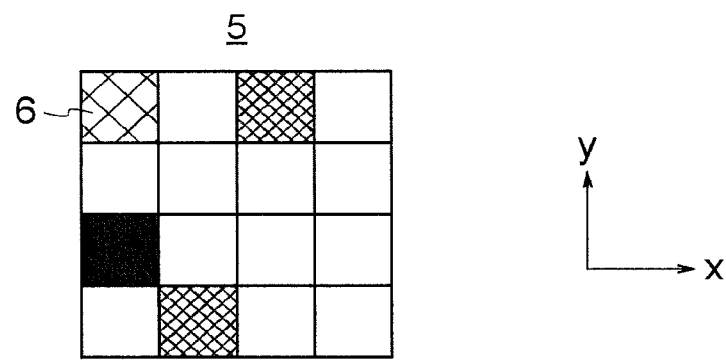
Figure 3C:
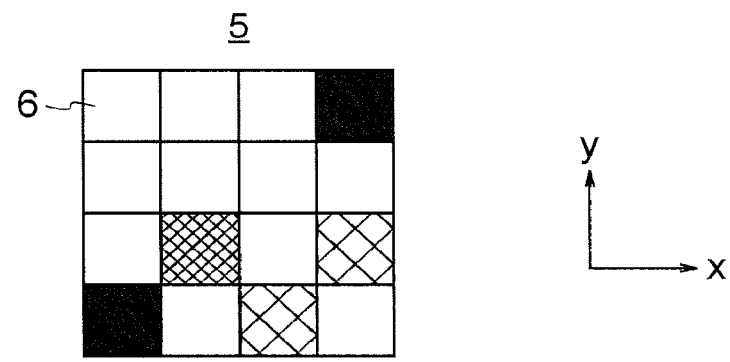

FIGS. 3A to 3C are diagrams showing examples of a cluster map 5 of the first embodiment.

In the substrate processing system of the present embodiment, information about the positions of the pixels 3 formed in the each of the clusters 4 in the substrate 1, is used as the cluster map 5. FIG. 3A is the cluster map 5 related to the first type pixels 3. FIG. 3B is the cluster map 5 related to the second type pixels 3. FIG. 3C is the cluster map 5 related to the third type pixels 3. As shown in the drawings, the cluster map 5 is given for each type of the pixels 3.

A detailed description of the cluster map 5 in FIG. 3A is given below. The same description applies to the cluster maps 5 in FIGS. 3B and 3C.

FIG. 3A shows an x direction corresponding to the X direction in the substrate 1, and a y direction corresponding to the Y direction in the substrate 1. The shapes and arrangement of clusters 6 shown in FIG. 3A correspond to the geometries or plane arrangement of the clusters 4 in the substrate 1. That is, the clusters 4 are actually existing clusters, whereas the clusters 6 are clusters in the data of the cluster map 5.

FIG. 3A shows the clusters 6 denoted by reference characters C1 to C3. The cluster 6 denoted by reference character C1 corresponds to the cluster 4 in which no first type pixel 3 is formed. The cluster 6 denoted by reference character C2 corresponds to the cluster 4 in which the first type pixels 3 has already been formed. The cluster 6 denoted by reference character C3 also corresponds to the cluster 4 in which the first type pixels 3 has already been formed, but the cluster 6 denoted by reference character C3 expresses the pixels 3 which applies the less applied stress, compared with the cluster 6 denoted by reference character C2. For example, when the magnitude of the applied stress is expressed by a value of 0 to 1, the clusters 6 denoted by reference characters C1, C2, C3 express the pixels 3 applied by which the applied stress is 0, 1, K, respectively (K represents a real number of 0 to 1).

FIG. 3A shows the clusters 6 denoted by reference characters C3a, C3b as examples of the clusters 6 denoted by reference character C3. For example, the applied stress by the cluster 6 denoted by reference character C3a is 0.3, and the applied stress by the cluster 6 denoted by reference character C3b is 0.7.

Arrangement of the pixels 3 in each of the clusters 4 in the substrate 1 may be arrangement other than any of the first to third types. In a case where a fourth type arrangement is used, for example, a fourth type of the cluster map 5 also may be used. An arrangement type other than any of the first to third types is described later.

Figure 4A:
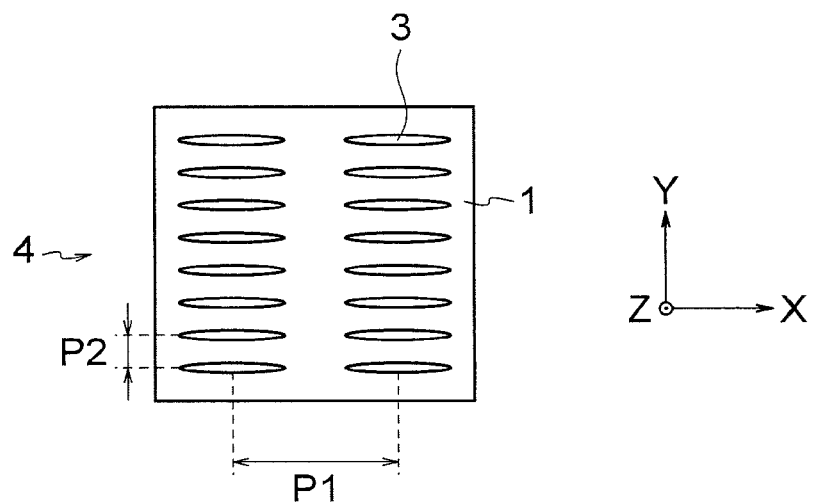
FIG. 4A and 4B are cross sectional views showing examples of the pixels in the substrate of the first embodiment.
Figure 4B:
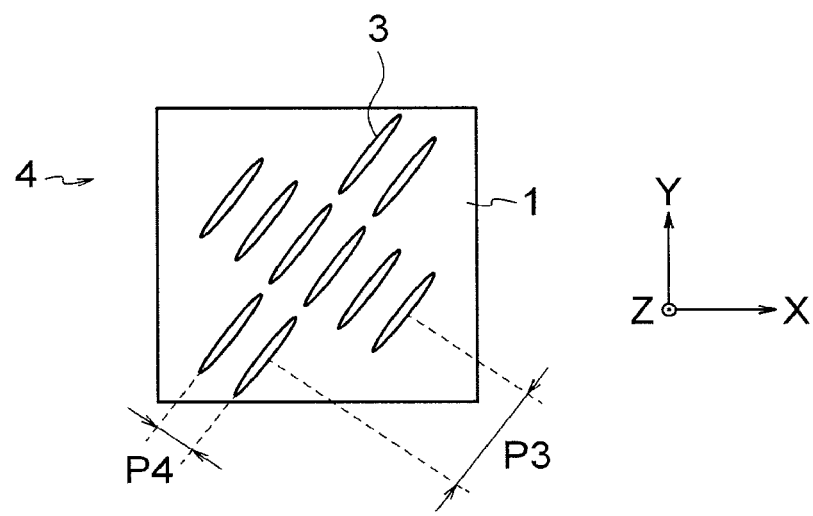

FIGS. 4A and 4B are cross sectional views showing examples of the pixels 3 in the substrate 1 of the first embodiment. FIGS. 4A and 4B each show the XY cross-section of the substrate 1.

FIG. 4A shows the first type pixels 3 formed in the cluster 4. FIG. 4A further shows a pitch P1 between the pixels 3 in the X direction, and a pitch P2 between the pixels 3 in the Y direction. In this case, the applied stress, the displacement and the dimension for the substrate 1 can be adjusted by variation of the pitches P1, P2.

FIG. 4B shows the pixels 3 of a type other than any of the first to third types formed in the cluster 4. FIG. 4B further shows a pitch P3 between the pixels 3 in a first oblique direction, and a pitch P4 between the pixels 3 in a second oblique direction. In this case, the applied stress, the displacement, and the dimension of the substrate 1 can be adjusted by variation of the pitches P3, P4.

As described above, in the present embodiment, the applied stress on the substrate 1, etc., can be adjusted by variation of the pitches P1, P2 between the first type pixels 3. The same applies to the second type and third type pixels 3. The third type pixels 3 can adjust the transmittance of the substrate 1, etc. As a result, an overlay error between the circuit patterns can be corrected.

However, adjustment of the first to third pixels 3 is insufficient to correct an error in some cases. In such a case, the pixels 3 of a type other than any of the first to third types may be used. However, such correction may be still insufficient. Therefore, the present embodiment realizes error correction having a higher degree of freedom by using the following method.

Figure 5A:
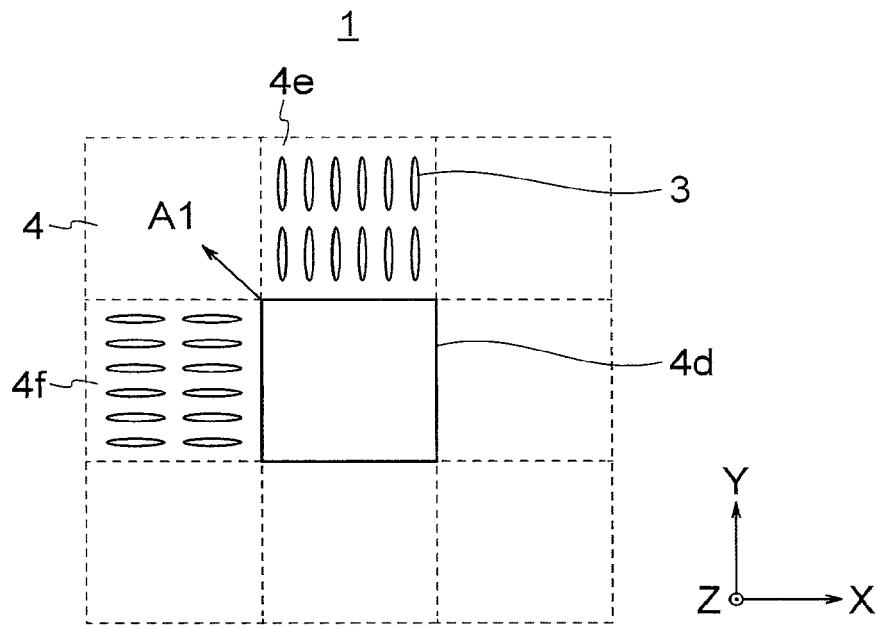
FIG. 5A and 5B are cross sectional views for explaining the pixels in the substrate of the first embodiment.
Figure 5B:
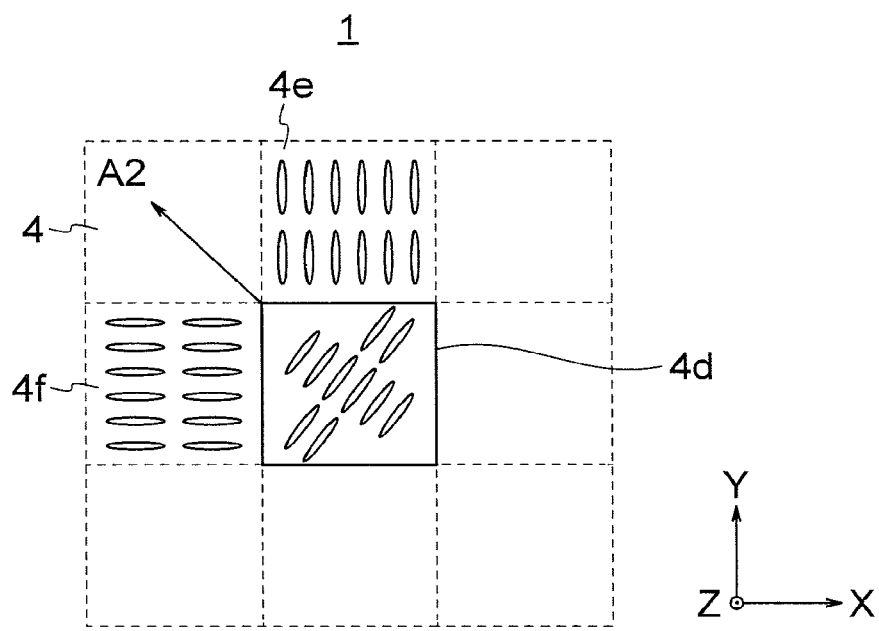

FIGS. 5A and 5B are cross sectional views for explaining the pixels 3 in the substrate 1 of the first embodiment. FIGS. 5A and 5B each show the XY cross section of the substrate 1.

FIG. 5A shows clusters 4d, 4e, 4f in each of which the pixels 3 have already been formed. The cluster 4d includes no pixel 3 in the cross section shown in FIG. 5A, but includes the pixels 3 in another cross section. Reference character A1 denotes a stress applied to the cluster 4d by the pixels 3 in the clusters 4d to 4f.

Here, a case where the stress A1 in the cluster 4d is to be increased. In this case, if the pixels 3 are newly formed in the clusters 4d to 4f, the pixels 3 that have already been formed in the clusters 4d to 4f may be damaged by the new pixels 3. For this reason, the new pixels 3 formed in the clusters 4d to 4f are difficult to increase the stress A1.

Therefore, in the present embodiment, when the pixel 3 is formed in a certain one of the clusters 4, not only the positions of the cluster 4 in the X direction and the Y direction but also the position of the pixel 3 in the Z direction within the cluster 4 is specified. That is, not only which of the clusters 4 the pixel 3 is formed in, but also the height of the pixel 3 within the cluster 4 is also specified. As a result, the pixels 3 can be newly formed in the clusters 4d to 4f while a damage to the pixels 3 that have already been formed in the clusters 4d to 4f is avoided.

FIG. 5B shows a state in which the pixels 3 are newly formed in the cluster 4d in the substrate 1 in FIG. 5A. By the new pixels 3, the applied stress on the cluster 4d can be increased from A1 to A2. The new pixels 3 are formed at the upper side (+Z direction) or the lower side (−Z direction) of the pixels 3 that have already been formed in the cluster 4d. That is, the former pixels 3 and the latter pixels 3 are arranged so as to be shifted in the Z direction, from each other. The pixels 3 that have already been formed exemplify the first pattern, and the new pixels 3 exemplify the second pattern.

Figure 6:
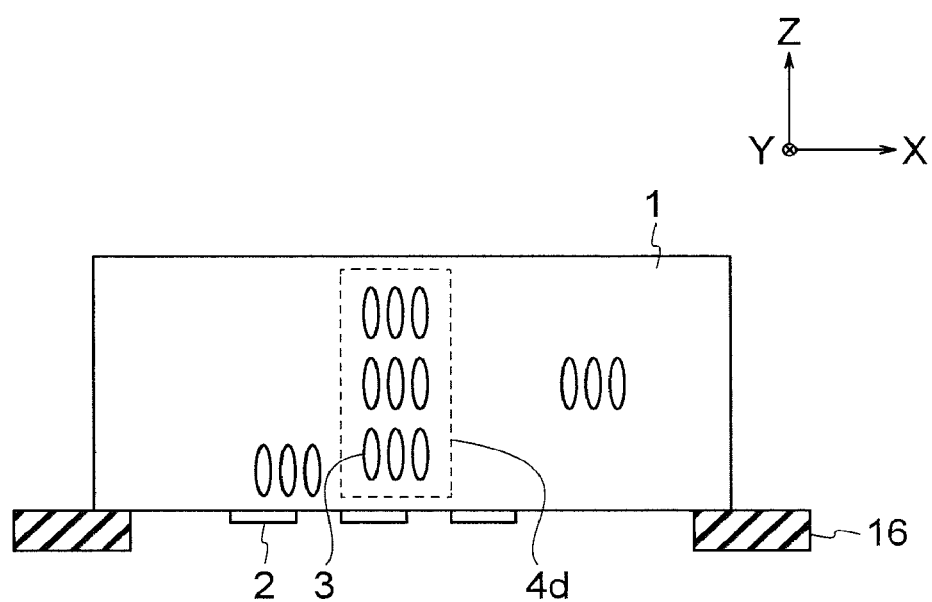
FIG. 6 is a cross sectional view for explaining the pixels in the substrate of the first embodiment.

FIG. 6 is a cross sectional view for explaining the pixels 3 in the substrate 1 of the first embodiment.

FIG. 6 shows the XZ cross section of the cluster 4d in the substrate 1. As described above, the clusters 4 of the present embodiment are columnar regions obtained by dividing the upper surface, the lower surface, or the XY cross section of the substrate 1 into a plurality of domains, and moving in the Z direction, the domains from the lower surface to the upper surface of the substrate 1. In the present embodiment, each of the domains has a rectangular shape, and the clusters 4 each have a quadratic prism shape.

The cluster 4d in FIG. 6 includes a first group of the pixels 3 formed near the lower surface of the substrate 1, a second group of the pixels 3 formed in the center portion of the substrate 1, and a third group of the pixels 3 formed near the upper surface of the substrate 1. According to the present embodiment, after the first group of the pixels 3 are formed, the second group and the third group of the pixels 3 can be newly formed on the first group of the pixels 3, for example.

Figure 7:
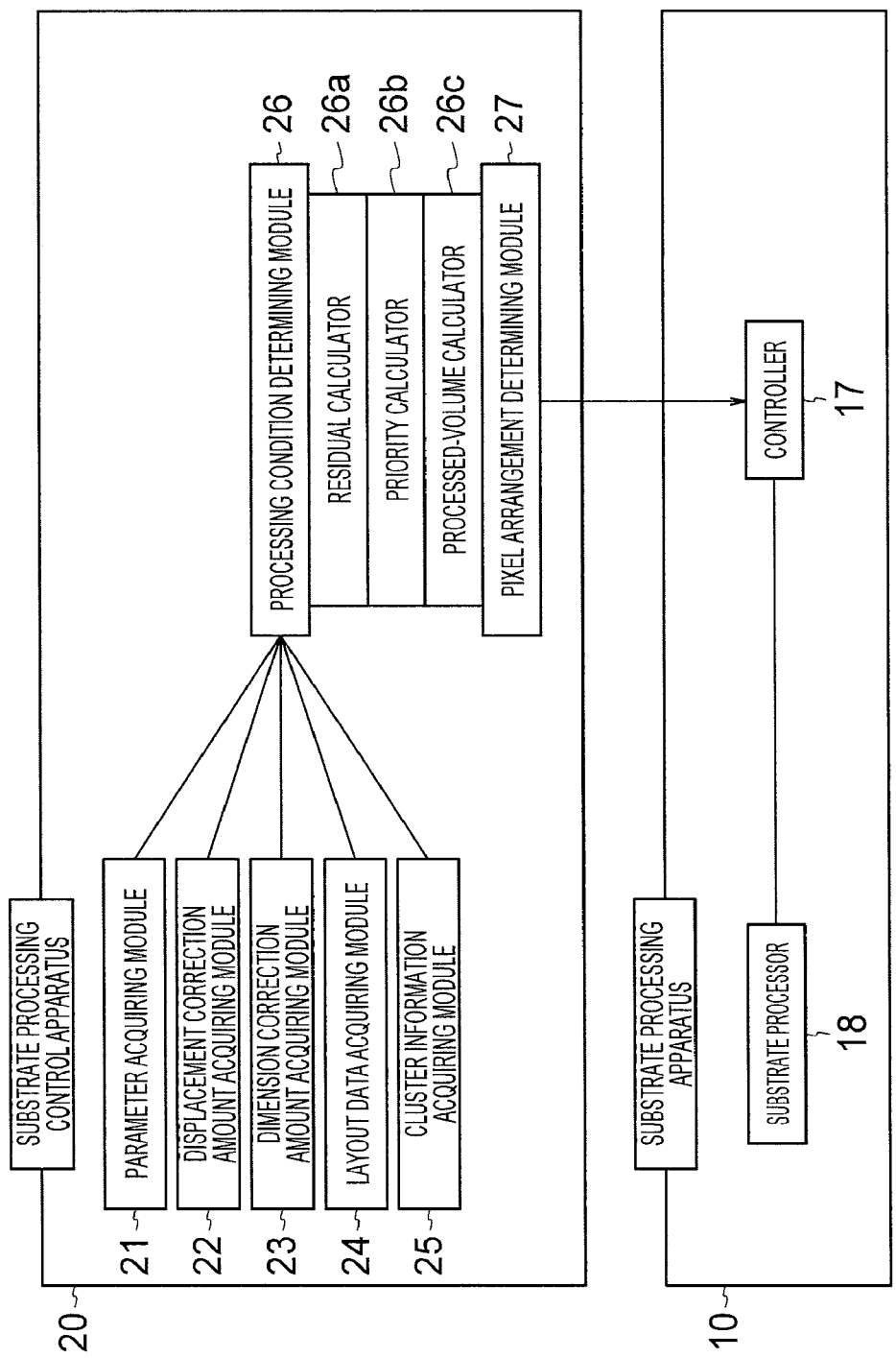
FIG. 7 is a schematic view showing the configuration of the substrate processing system of the first embodiment.

FIG. 7 is a schematic view showing the configuration of the substrate processing system of the first embodiment.

The substrate processing apparatus 10 includes a substrate processor 18 that corresponds to the light source 11, the optical path adjusting device 12, the beam splitter 13, the wavefront adjusting device 14, the lens 15, and the stage 16, and includes the controller 17. The controller 17 processes the substrate 1 by controlling operation of the substrate processor 18.

The substrate processing control apparatus 20 includes, as functional blocks implemented by the aforementioned substrate processing program 20a, a parameter acquiring module 21, a displacement correction amount acquiring module 22, a dimension correction amount acquiring module 23, a layout data acquiring module 24, a cluster information acquiring module 25 as an example of a position information acquiring module, a processing condition determining module 26 as an example of a substrate setting determining module, and a pixel arrangement determining module 27 as an example of a position determining module. The processing condition determining module 26 includes a residual calculator 26a as an example of a correction amount calculator, a priority calculator 26b, and a processed-volume calculator 26c.

The parameter acquiring module 21 acquires various parameters for the substrate processing apparatus 10, such as information about the performance of the light source 11 or about operation of the stage 16. These parameters may be acquired from the substrate processing apparatus 10 by the parameter acquiring module 21, or may be inputted into the substrate processing control apparatus 20 by a user.

The displacement correction amount acquiring module 22 acquires a target displacement correction amount which is determined in advance for correction of displacement of the substrate 1 and/or the correction amount of displacement of the substrate 1 corrected by the pixels 3 that have already been formed in the substrate 1. The dimension correction amount acquiring module 23 acquires a target dimension correction amount which is determined in advance for correction of a dimension of the substrate 1 and/or the correction amount of a dimension of the substrate 1 corrected by the pixels 3 that have already been formed in the substrate 1. Correction amounts stored in the substrate processing apparatus 10 may be acquired as these correction amounts by the displacement correction amount acquiring module 22 and the dimension correction amount acquiring module 23, or these correction amounts may be inputted into the substrate processing control apparatus 20 by a user. These correction amounts can be calculated by use of the cluster map 5, for example.

The layout data acquiring module 24 acquires layout data of a light shielding pattern by the light shielding film 2. The layout data may be automatically acquired from another component in the substrate processing control apparatus 20 or another apparatus by the layout data acquiring module 24, or may be inputted into the substrate processing control apparatus 20 by a user.

The cluster information acquiring module 25 acquires information about the clusters 4 that have already been processed in the substrate 1. Hereinafter, this information is referred to as "processed cluster information". For example, the cluster information acquiring module 25 acquires information about the positions of the clusters 4 in which the pixels 3 have already been formed, or information about the positions of the pixels 3 that have already been formed in the clusters 4. The former positions can be specified by the positions of the clusters 4 in the X direction and the Y direction, and specifically, can be specified by the positions of the clusters 6 in the cluster map 5 in the x direction and the y direction. The latter positions can be specified by the positions of the pixels 3 formed in the clusters 4 in the Z direction. The former positions exemplify the positions in the in-plane direction of the substrate 1. The latter positions exemplify the positions in the thickness direction of the substrate 1. In addition, the pixels 3 that have already been formed in the substrate 1 exemplify the first pattern. The processed cluster information may be automatically acquired from the substrate processing control apparatus 20 or a different apparatus by the cluster information acquiring module 25, or may be inputted into the substrate processing control apparatus 20 by a user.

The processing condition determining module 26 determines a processing condition related to the pixels 3 to be newly formed in the substrate 1, in accordance with the aforementioned parameters, the displacement correction amount, the dimension correction amount, the layout data, and the processed cluster information. Examples of the processing condition include the applied stress on the substrate 1 and the transmittance of the substrate 1 which are set by the new pixels 3. The applied stress on the substrate 1 and the transmittance of the substrate 1 are determined for each of all the clusters 4 in the substrate 1. The pixels 3 to be newly formed in the substrate 1 exemplify the second pattern.

The displacement correction amount refers to a target displacement correction amount which is determined in advance for correction of displacement of the substrate 1 and/or a correction amount of displacement of the substrate 1 corrected by the pixels 3 that have already been formed in the substrate 1. The dimension correction amount refers to a target dimension correction amount which is determined in advance for correction of a dimension of the substrate 1 and/or the correction amount of the dimension of the substrate 1 corrected by the pixels 3 that have already been formed in the substrate 1.

The pixel arrangement determining module 27 determines arrangement of the pixels 3 to be newly formed in the substrate 1 in accordance with the processing condition such as the applied stress or the transmittance determined by the processing condition determining module 26. For example, the pixel arrangement determining module 27 determines the positions of the clusters 4 in which the pixels 3 are to be newly formed, or the positions of the pixels 3 to be newly formed in each of the clusters 4. The former positions can be specified by the positions of the clusters 4 in the X direction and the Y direction, and specifically, can be specified by the positions of the clusters 6 to be newly added to the cluster map 5 in the x direction and the y direction. The latter positions can be specified by the positions of the pixels 3 to be newly formed in each of the clusters 4 in the Z direction.

Here, as has been described with reference to FIGS. 5A and 5B, when the pixels 3 are additionally formed in the cluster 4 in which the pixels 3 have already been formed, the pixels 3 that have already been formed may be damaged. Therefore, the pixel arrangement determining module 27 determines to form the new pixels 3 on the upper side or the lower side of the pixels 3 that have already been formed. Such determination can be made because the positions of the pixels 3 that have already been formed in the clusters 4 in the Z direction are specified by the processed cluster information of the present embodiment.

The pixel arrangement determining module 27 outputs, to the substrate processing apparatus 10, the determination result of arrangement of the pixels 3 to be newly formed in the substrate 1. Hereinafter, information about this determination result is referred to as "process target pixel information". The process target pixel information includes information about the cluster map 5 for specifying the pixels 3 that have already been formed in the substrate 1 and the pixels 3 to be newly formed in the substrate 1, and information about the positions of the pixels 3 in the Z direction. For example, the process target pixel information is stored as new processed cluster information in the substrate processing control apparatus 20.

The controller 17 receives the process target pixel information from the pixel arrangement determining module 27, and causes the substrate processor 18 to process the substrate 1 in accordance with the process target pixel information. As a result, the new pixels 3 are formed in the substrate 1, and a new photomask is manufactured. Specifically, the new pixels 3 are added to the existing photomask, so that the existing photomask is reproduced to be a new photomask.

The specific operation of the processing condition determining module 26 of the present embodiment is as follows.

The residual calculator 26a determines the applied stress and the transmittance to be set by the newly formed pixels 3, as described above. Further, the residual calculator 26a calculates the correction amounts of the displacement and the dimension of the substrate 1 to be corrected by the newly formed pixels 3, in accordance with the determined applied stress and the determined transmittance. Moreover, the residual calculator 26a calculates the residue of each of the correction amounts. The residue of the correction amount refers to the difference between the correction amount of the displacement or the dimension to be corrected by the newly formed pixels 3 and the target displacement correction amount or the target dimension correction amount which is determined in advance for correction of the displacement or the dimension, or the difference between the correction amount of the displacement or the dimension to be corrected by the newly formed pixels 3 and the correction amount of the displacement or the dimension corrected by the pixels 3 that have already been formed. For example, in a case where the dimension set value of a certain portion of the substrate 1 is 1 μm, the correction amount of the dimension of the portion is increased from 0.2 μm to 0.3 μm, such that the dimension of the portion is corrected from 1.2 μm to 1.3 μm. In this case, the residue is 0.1 μm.

The priority calculator 26b calculates the priority of each of the clusters 4 in which the pixels 3 are to be newly formed, in accordance with the information about the positions of the pixels 3 that have already been formed. For example, the priority of the cluster 4 in which no pixel 3 has been formed may be set to be higher than the priority of the cluster 4 in which the pixels 3 have already been formed, such that the pixels 3 are preferentially formed in the cluster 4 in which no pixel 3 has been formed. In view of FIGS. 3A to 3C, the priority of the cluster 4 in which the stress is zero may be set to be higher than the priority of the cluster 4 in which the stress is not zero. Alternatively, the priority of the cluster 4 in which the stress is smaller may be set to be higher.

The processed-volume calculator 26c calculates the volume of the cluster 4 in which the pixels 3 are to be newly formed, in accordance with the information about the positions of the pixels 3 that have already been formed. For example, when the pixels 3 are to be newly formed in four of the clusters 4, the volumes of the four clusters 4 are calculated. Here, instead of the volume of the entire portion of the clusters 4, the volume of portions in the clusters 4 where the pixels 3 are to be newly formed may be calculated. For example, when the pixels 3 are to be newly formed in a one-tenth portion of the clusters 4, one tenth of the volume of the four clusters 4 is calculated.

The pixel arrangement determining module 27 determines arrangement of the pixels 3 to be newly formed, in accordance with the residue, the priorities, and the volume calculated by the processing condition determining module 26. Specifically, the pixel arrangement determining module 27 calculates the weighted average value by weighting and averaging the residue, the priorities, and the volume, and determines the arrangement of the pixels 3 so as to make the weighted average value minimum. A detailed description of the weighted average is given later.

Figure 8:
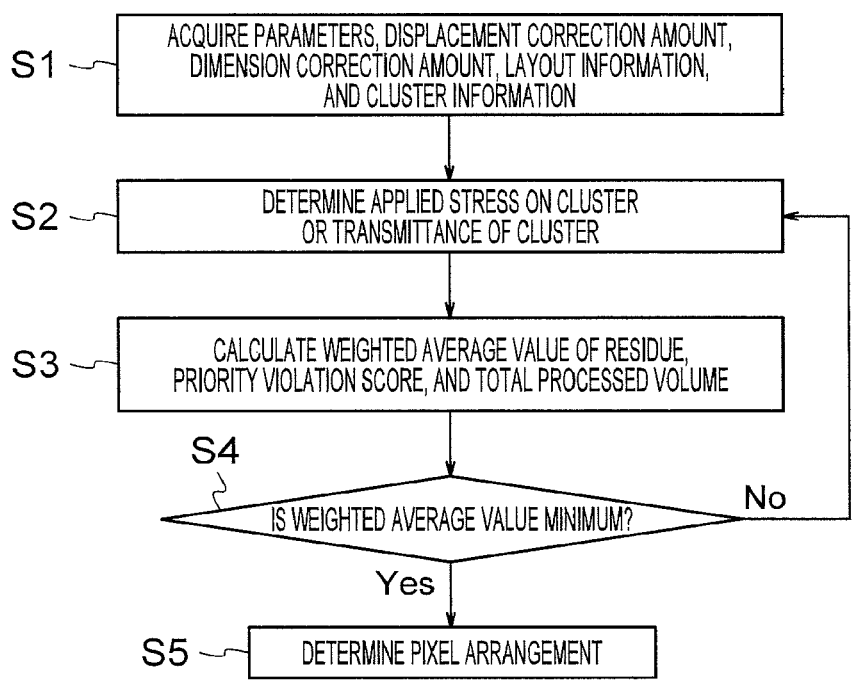
FIG. 8 is a flowchart showing operation of a substrate processing control apparatus of the first embodiment.

FIG. 8 is a flowchart showing operation of the substrate processing control apparatus 20 of the first embodiment.

First, the parameter acquiring module 21, the displacement correction amount acquiring module 22, the dimension correction amount acquiring module 23, the layout data acquiring module 24, and the cluster information acquiring module 25 acquire the aforementioned parameters, the displacement correction amount, the dimension correction amount, the layout data, and the processed cluster information, respectively (step S1).

Next, in accordance with the information acquired at step S1, the processing condition determining module 26 determines, for each of the clusters 4, an applied stress and a transmittance to be set by the pixel 3 to be newly formed (step S2).

Next, the residual calculator 26a, the priority calculator 26b, and the processed-volume calculator 26c calculate the residue, a priority violation score, and a total processed volume, respectively, and the pixel arrangement determining module 27 calculates the weighted average value of the residue, the priorities, and the volume (step S3). The priority violation score refers to a score obtained by dig italizing which cluster 4 is unpreferable for new formation of the pixels 3 therein from the viewpoint of the priorities. The total processed volume refers to the total volume of the cluster 4 in which the pixels 3 are to be newly formed or of a portion where the pixels 3 are to be newly formed.

In the present embodiment, the processes at steps S2 and S3 are repeated to specify a case where the weighted average value becomes minimum (step S4). The pixel arrangement determining module 27 determines arrangement of the pixels 3 for a case where the weighted average value becomes minimum (step S5). Accordingly, reduction in the residue, increase in the number of times of allowing processing of the substrate 1, and reduction in the volume by which the substrate 1 is processed can be achieved simultaneously, for example.

At steps S2 to S4 of the present embodiment, various types of two-dimensional arrangement of the pixels 3 to be newly formed are temporarily determined, the weighted average values are calculated for these types of two-dimensional arrangement, and the two-dimensional arrangement in which the weighted average value becomes the minimum is specified. Two-dimensional arrangement of the pixels 3 refers to arrangement of the pixels 3 in the X direction and the Y direction. At step S5 of the present embodiment, three-dimensional arrangement of the pixels 3 are determined with use of the two-dimensional arrangement in which the weighted average value becomes minimum. The three-dimensional arrangement of the pixels 3 refers to arrangement of the pixels 3 in the X direction, the Y direction, and the Z direction.

The weighted average value is obtained by objective function f below.

$$f = \Sigma_i \{ w_{x,i}(-\delta x_i + k_{1,i} + k_{3,i} x_i + k_{5,i} y_i + \Delta x_i)^2 + w_{y,i}(-\delta y_i + k_{2,i} + k_{4,i} y_i + k_{6,i} x_i + \Delta y_i)^2 \} + \Sigma_j v_j.$$

In the function, "i" represents an index for identifying control points (points where a displacement is desired to be generated). "$\Sigma_i$" represents a total sum related to N control points "i" (=1 to N). "$x_i$, $y_i$" represent the X coordinate and the Y coordinate of a control point, respectively. "$\Delta x_i$, $\Delta y_i$" represent displacements to be desired to be generated in the X direction and the Y direction at a control point, respectively. "$\delta x_1$, $\delta y_i$" represent displacements which are actually generated in the X direction and the Y direction at a control point by processing of the substrate, respectively. "$w_{x,i}$, $w_{y,i}$" are weighting factors to which the degree of importance of the X direction and the degree of importance of the Y direction are added, respectively, such that when the factors become larger, the degrees of importance become higher. "$k_{1,i}$, $k_{2,i}$, $k_{3,i}$, $k_{4,i}$, $k_{5,i}$, $k_{6,i}$," are parameters for displacements which can be corrected by the substrate processing apparatus 10. The number of the parameters in the present embodiment are six. However, the number may be seven or greater by introduction of a term of "$x_i^2$", a term of "$y_i^2$", a term of "$x_i y_i$", etc.

In addition, "j" represents an index for identifying for a region in the substrate 1 where the pixels 3 are to be formed. For example, when M1 of the clusters 4 exist in the substrate 1 and each of the clusters 4 is divided into M2 regions such that the pixels 3 are formed therein, the total number of the regions is M (=M1×M2). "$\Sigma_j$" represents a total sum related to the regions j where the pixels 3 are to be newly formed. When the number of the regions j where the pixels 3 are newly to be formed is K, the total sum $\Sigma_j$ is calculated for the K regions j. "vj" represents the volume of the region j. When the region j where the pixels 3 are newly to be formed is selected, the region j closer to the lower surface of the substrate 1 is preferentially selected. A boundary condition not to select the region j where the pixel 3 has already been formed is used. The boundary condition is related to the aforementioned priority violation score.

As described above, the substrate processing control apparatus 20 of the present embodiment determines the positions of the pixels 3 to be newly formed in the substrate 1, in accordance with the information about the positions of the pixels 3 that have already been formed in the substrate 1. Therefore, according to the present embodiment, the applied stress on the photomask substrate 1 and the transmittance of the photomask substrate 1 can be appropriately changed, so that an overlay error between the circuit patterns can be reduced. As a result, the yield of a semiconductor device which is manufactured with use of the photomask can be improved.

Second Embodiment

Figure 9:
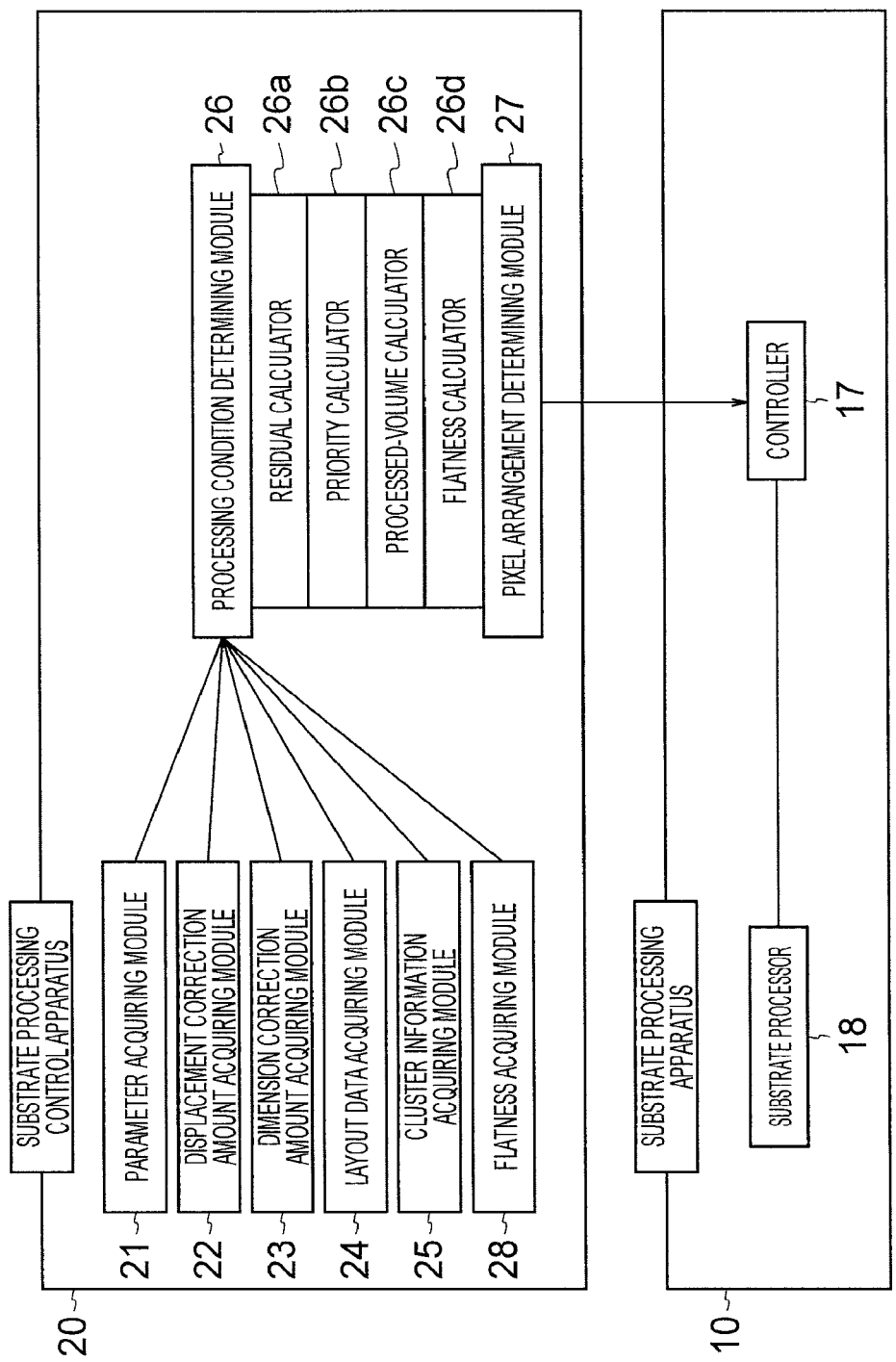
FIG. 9 is a schematic view showing the configuration of a substrate processing system of a second embodiment.

FIG. 9 is a schematic view showing the configuration of a substrate processing system of a second embodiment.

The substrate processing control apparatus 20 in FIG. 9 includes, in addition to the components shown in FIG. 7, a flatness acquiring module 28 and a flatness calculator 26d in the processing condition determining module 26.

The flatness acquiring module 28 acquires the flatness of the upper surface (or the lower surface) of the substrate 1 before formation of the new pixels 3. The flatness of the substrate 1 affects the focusing accuracy and the overlay accuracy when lithography is carried out with use of the photomask. The flatness may be acquired from the substrate processing apparatus 10 by the flatness acquiring module 28, or may be inputted into the substrate processing control apparatus 20 by a user.

The flatness calculator 26d calculates the flatness of the upper surface (or the lower surface) of the substrate 1 after formation of the new pixels 3, in accordance with the flatness acquired by the flatness acquiring module 28. The pixel arrangement determining module 27 determines the positions of the pixels 3 to be newly formed, in accordance with the flatness calculated by the flatness calculator 26d. Specifically, this determination is made such that the flatness after formation of the new pixels 3 becomes an appropriate value.

According to the present embodiment, improvement of the flatness of the substrate 1 results in improvement of the focusing accuracy and the overlay accuracy when the photomask is used. Accordingly, the yield of a semiconductor device can be improved.

Third Embodiment

Figure 10:
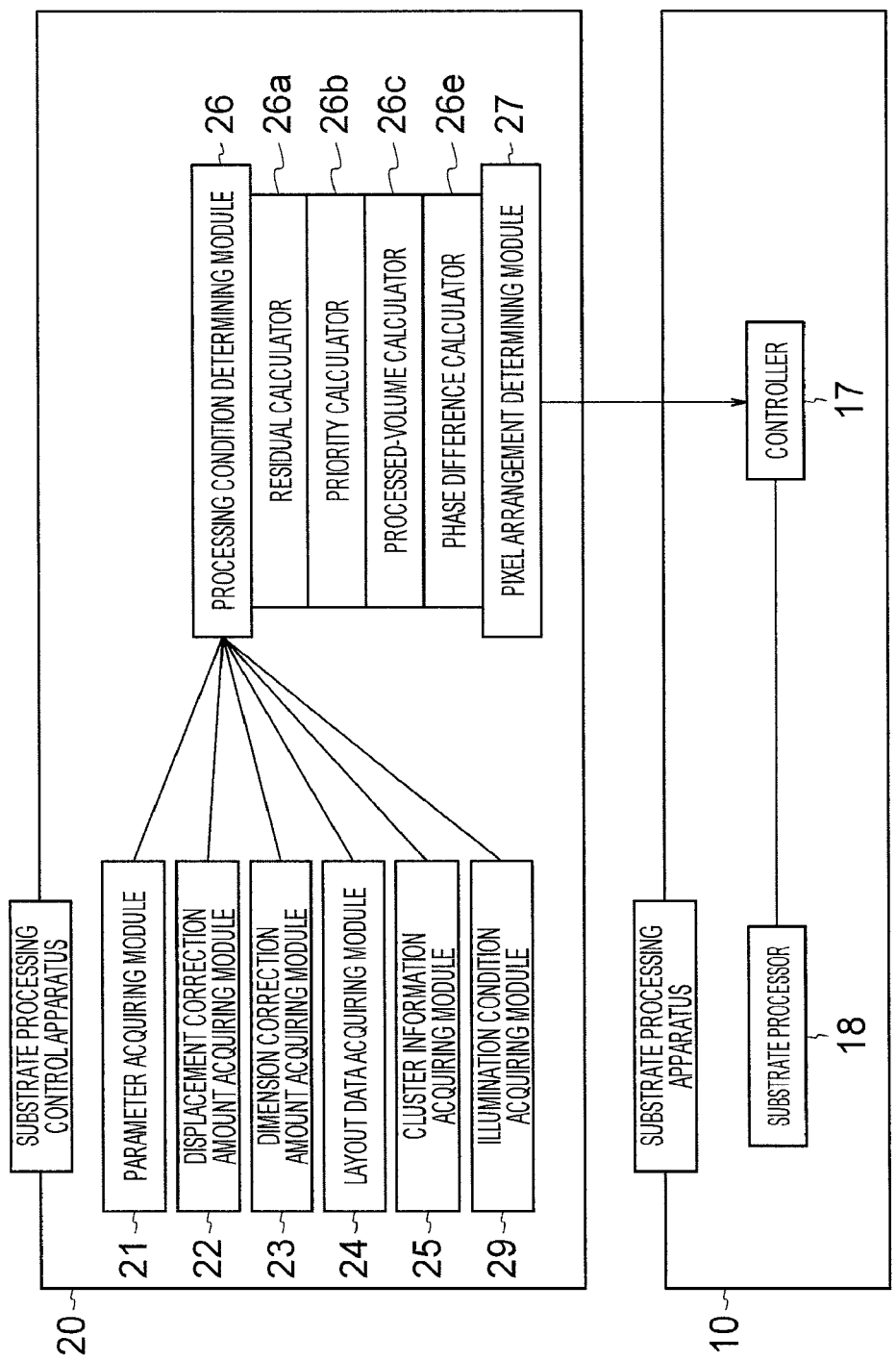
FIG. 10 is a schematic view showing the configuration of a substrate processing system of a third embodiment.

FIG. 10 is a schematic view showing the configuration of a substrate processing system of a third embodiment.

The substrate processing control apparatus 20 of FIG. 10 includes, in addition to the components shown in FIG. 7, an illumination condition acquiring module 29, and a phase difference calculator 26e in the processing condition determining module 26. The illumination condition acquiring module 29 exemplifies an optical information acquiring module.

The illumination condition acquiring module 29 acquires information about the optical characteristics obtained when the substrate 1 is irradiated with light, or, for example, information for specifying the orbit or the propagation form of the light in the substrate 1. The information is used, for example, to process the substrate 1 such that, when lithography is carried out with use of the photomask, light having a prescribed phase is not allowed to transmit through the photomask. The information may be acquired from the substrate processing apparatus 10 by the illumination condition acquiring module 29, or may be inputted in to the substrate processing control apparatus 20 by a user.

The phase difference calculator 26e calculates, in accordance with the information acquired by the illumination condition acquiring module 29, a phase difference between optical paths when the pixels 3 are newly formed. The pixel arrangement determining module 27 determines, in accordance with the phase difference calculated by the phase difference calculator 26e, the positions at which the pixels 3 are to be newly formed. Specifically, this determination is made so as not to allow light having a prescribed phase to transmit through the photomask when the pixels 3 are newly formed.

According to the present embodiment, as a result of the aforementioned adjustment of the phase difference, light that is not preferable, for example, for lithography can be removed. Accordingly, the yield of a semiconductor device can be improved.

Fourth Embodiment

Figure 11:
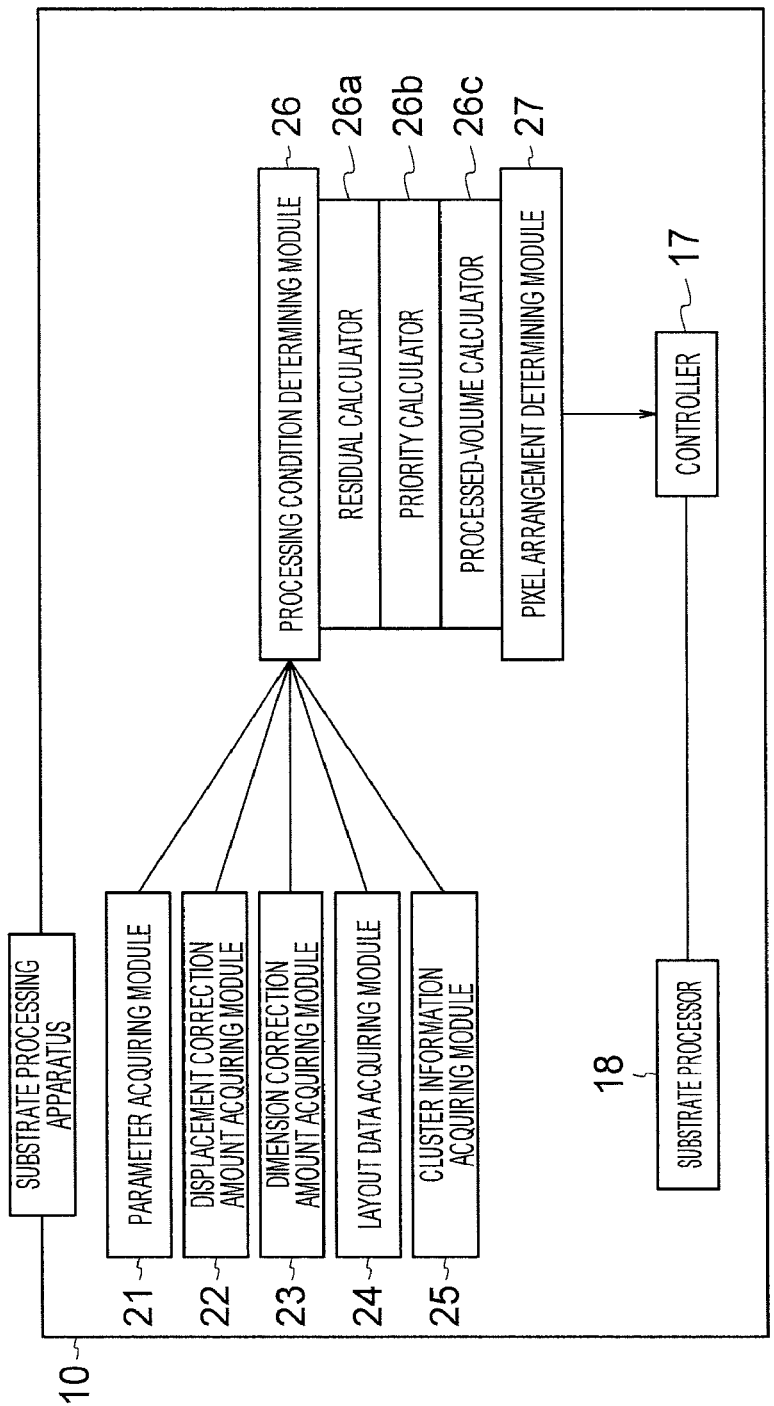
FIG. 11 is a schematic view showing the configuration of a substrate processing system of a fourth embodiment.

FIG. 11 is a schematic view showing the configuration of a substrate processing system of a fourth embodiment.

In the present embodiment, the function of the substrate processing apparatus 10 and the function of the substrate processing control apparatus 20 of the first embodiment are implemented by the substrate processing apparatus 10 in FIG. 11 alone. That is, the substrate processing apparatus 10 in FIG. 11 functions as the substrate processing apparatus 10 and the substrate processing control apparatus 20 of the first embodiment. The substrate processing apparatus 10 in FIG. 11 includes, in addition to the controller 17 and the substrate processor 18, the parameter acquiring module 21, the displacement correction amount acquiring module 22, the dimension correction amount acquiring module 23, the layout data acquiring module 24, the cluster information acquiring module 25, the processing condition determining module 26, and the pixel arrangement determining module 27, which are identical to those in FIG. 7.

According to the present embodiment, control the same as that in the first embodiment can be performed by the substrate processing apparatus 10 alone. The configuration of the present embodiment may be applied to the second embodiment or the third embodiment.

Fifth Embodiment

Figure 12:
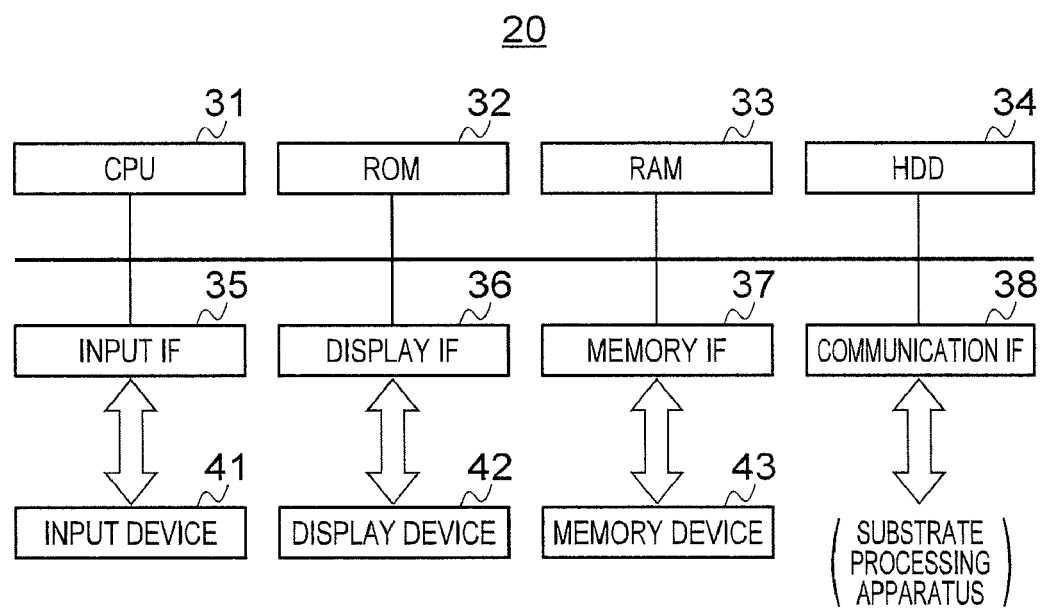
FIG. 12 is a schematic view showing the configuration of a substrate processing control apparatus of a fifth embodiment.

FIG. 12 is a schematic view showing the configuration of the substrate processing control apparatus 20 of a fifth embodiment.

The substrate processing control apparatus 20 in FIG. 12 includes a CPU (central processing unit) 31, a ROM (read only memory) 32, a RAM (random access memory) 33, and an HDD (hard disc drive) 34.

The substrate processing control apparatus 20 in FIG. 12 further includes an input IF (interface) 35 for an input device 41 such as a mouse or a keyboard, a display IF 36 for a display device 42 such as a liquid crystal display, a memory IF 37 for a memory device such as a semiconductor memory, and a communication IF 38 for network communication. The substrate processing control apparatus 20 can communicate with the substrate processing apparatus 10 via the communication IF 38.

The substrate processing program 20a is stored in the ROM 32 or the HDD 34, and is executed by the CPU 31. Accordingly, the functional blocks of the substrate processing control apparatus 20 of any one of the first to third embodiments can be implemented. When the substrate processing program 20a is stored in the ROM 32 or the HDD 34, the substrate processing control apparatus 20 may acquire the substrate processing program 20a from the semiconductor memory via the memory IF 37, or may download the substrate processing program 20a from a network via the communication IF 38.

According to the present embodiment, the processes to be performed by the substrate processing control apparatus 20 of any one of the first to third embodiments, can be performed. The configuration in FIG. 12 may also applied to the substrate processing apparatus 10 of the fourth embodiment.

While certain embodiments have been described, these embodiments have been presented by way of example only, and are not intended to limit the scope of the inventions. Indeed, the novel apparatuses, methods and media described herein may be embodied in a variety of other forms; furthermore, various omissions, substitutions and changes in the form of the apparatuses, methods and media described herein may be made without departing from the spirit of the inventions. The accompanying claims and their equivalents are intended to cover such forms or modifications as would fall within the scope and spirit of the inventions.

The invention claimed is:

1. A substrate processing control apparatus comprising:
a position information acquiring module configured to acquire information about a position of a first pattern that is formed in a substrate for a photomask to change an applied stress to the substrate or to change a transmittance of the substrate,
a position determining module configured to determine, in accordance with the information about the position of the first pattern, a. position of a second pattern to be formed in the substrate to change the applied stress to the substrate or the transmittance of the substrate:
a parameter acquiring module configured to acquire a parameter for an apparatus that processes the substrate;
a correction amount acquiring module configured to acquire a target displacement correction amount and a target dimension correction amount that are determined in advance for correction of a displacement and a dimension of the substrate, and/or acquire a correction amount of the displacement and a correction amount of the dimension of the substrate that are corrected by the first pattern;

a layout data acquiring module configured to acquire layout data of a film that is formed in the substrate for lithography; and a substrate setting determining module configured to determine the applied stress to the substrate or the transmittance of the substrate to be set by the second pattern, in accordance with the parameter, the correction amounts, the layout data, and the information about the position of the first pattern, wherein the position determining module determines the position of the second pattern, in accordance with the applied stress or the transmittance that is determined by the substrate setting determining module.

2. The apparatus of claim 1, wherein the substrate setting determining module comprises:

a correction amount calculator configured to calculate, in accordance with the determined applied stress or the determined transmittance, the correction amount of the displacement and the correction amount of the dimension of the substrate to be corrected by the second pattern, a priority calculator configured to calculate, in accordance with the information about the position of the first pattern, a priority of a region where the second pattern is to be formed in the substrate, and.

a volume calculator configured to calculate, in accordance with the information about the position of the first pattern, a volume of the region where the second pattern is to be formed in the substrate, wherein the position determining module configured to determine the position of the second pattern, in accordance with the correction amounts, the priority, and the volume that are calculated by the substrate setting determining module.

3. The apparatus of claim 1, wherein the position information acquiring module acquires the information about the position of the first pattern in an in-plane direction of the substrate, and the position of the first pattern in a thickness direction of the substrate, and the position determining module determines the position of the second pattern in the in-plane direction, and the position of the second pattern in the thickness direction.

4. The apparatus of claim 3, wherein in a case that the first pattern is located at a first position in the in-plane direction and is located at a second position in the thickness direction, when the position determining module determines to form the second pattern at the first position in the in-plane direction, the position determining module determines to form the second pattern at a position that is shifted from the second position in the thickness direction.

5. The apparatus of claim 3, wherein the positions of the first and second patterns in the in-plane direction are specified for each domain in a case that a surface or a cross section of the substrate is divided into a plurality of domains.

* * * * *